(12) United States Patent
Yamasaki

(10) Patent No.: US 8,042,587 B2
(45) Date of Patent: Oct. 25, 2011

(54) TAPE CUTTING DEVICE AND TAPE FEEDER CHANGING CARRIAGE

(75) Inventor: Kimiyuki Yamasaki, Fukuoka (JP)

(73) Assignee: Panasonic Corporation, Osaka (JP)

( * ) Notice: Subject to any disclaimer, the term of this patent is extended or adjusted under 35 U.S.C. 154(b) by 133 days.

(21) Appl. No.: 12/204,508

(22) Filed: Sep. 4, 2008

(65) Prior Publication Data

US 2009/0065149 A1    Mar. 12, 2009

(30) Foreign Application Priority Data

Sep. 6, 2007   (JP) ................. 2007-230954
Sep. 6, 2007   (JP) ................. 2007-230955

(51) Int. Cl.
*B26D 5/00*   (2006.01)
*B32B 38/00*  (2006.01)

(52) U.S. Cl. ........................ 156/353; 156/510
(58) Field of Classification Search .................. 156/353, 156/510

See application file for complete search history.

(56) References Cited

U.S. PATENT DOCUMENTS

| 3,452,630 A * | 7/1969 | Malm ........................... 83/380 |
| 3,970,507 A * | 7/1976 | Dalzell et al. ................ 156/446 |
| 6,539,622 B2 * | 4/2003 | Hidese et al. ................. 29/832 |

FOREIGN PATENT DOCUMENTS

| JP | 2001-121480 A | 5/2001 |
| JP | 2002-111281 A | 4/2002 |
| JP | 2003-218587   | 7/2003 |
| JP | 2004-228244 A | 8/2004 |
| JP | 2005-161481 A | 6/2005 |

* cited by examiner

Primary Examiner — Katarzyna Wyrozebski Lee
Assistant Examiner — Carson Gross
(74) Attorney, Agent, or Firm — Pearne & Gordon LLP

(57) ABSTRACT

A tape cutting device that cuts off an empty tape, which is discharged from a tape feeder after supplying components to a component mounting apparatus by pitch-feeding a tape containing the components, by opening and closing two cutting blades actuated by a pneumatic actuator driven by a supply of a pressurized air from a pneumatic pressure source controlled by a control valve, comprising:
   a blade closing mechanism which closes said two cutting blades when the supply of the pressurized air from the pneumatic pressure source to the pneumatic actuator is stopped.

6 Claims, 5 Drawing Sheets

TAPE CUTTING DEVICE AND TAPE FEEDER CHANGING CARRIAGE

BACKGROUND OF THE INVENTION

1. Field of the Invention

This invention relates to a tape cutting device cutting off an empty tape discharged from a tape feeder by opening and closing operation of two cutting blades and a tape feeder changing carriage which includes such tape cutting device and with which an install and a removal of a plurality of tape feeders mounted thereon to the component mounting apparatus are performed.

2. Related Art

The tape feeder is attached to a predetermined position in the component mounting apparatus and supplies components to a pick-up position to a mount head by feeding a tape for supplying components. A so-called empty tape that is left after supplying components is cut off by opening/closing operation of two cutter blades in a tape cutting device disposed below the tape feeder, and collected in a box-shaped tape collecting device disposed below the tape cutting device.

When a plurality of such tape feeder changing carriages are installed to a component mounting apparatus, install operations and removal operations are usually troublesome and require heavy workload. Therefore, conventionally, there has been proposed a tape feeder changing carriage with which a plurality of tape feeders can be installed together to the component mounting apparatus. In such a tape feeder changing carriage, a feeder base to which the tape feeders are mounted is provided in a carriage body portion that is movable by operating a lever. The tape feeder changing carriage is able to install and remove the tape feeders collectively to the component mounting apparatus by attaching and detaching the carriage body portion to the component mounting apparatus. When the tape feeder changing carriage is attached to the component mounting apparatus, the tape cutting device provided in the component mounting apparatus enters into a space below the feeder base of the tape feeder changing carriage. The tape discharged from the tape feeder is guided to the tape cutting device by a tape guiding member provided on the tape feeder side or the component mounting apparatus side. See Japanese Patent No. 3861694.

However, as described above, in a conventional case that the tape discharged from the tape feeder is configured to pass through a member on the component mounting apparatus side (namely the tape cutting device), the operation to introduce the tape led from each tape feeder to the tape cutting device is allowed to be performed only after the tape feeder has been installed to the component mounting apparatus (namely, after the tape feeder changing carriage has been attached to the component mounting apparatus). Further, the operation to remove the tape feeder from the component mounting apparatus (namely, the operation to detach the tape feeder changing carriage from the component mounting apparatus) is allowed to be performed only after removing the empty tape extended from each tape feeder out of the tape cutting device. Accordingly, it takes time to perform the install operation and removal operation of the tape feeders, so that throughput of mounting the components by the component mounting apparatus is deteriorated.

Moreover, the conventional tape cutting device as described above is often configured such that two cutting blades are kept open when the device is not operated. Accordingly, there is a fear that foreign matters intervenes between two cutting blades to cause troubles.

SUMMARY OF THE INVENTION

The present invention has been made in view of the above circumstances, and the invention is directed to provide a tape cutting device to prevent an intervention of foreign matters between two cutting blades when the tape cutting device is not operated and to provide a tape feeder changing carriage which can reduce operating time required to install or remove the tape feeders so that throughput of mounting the components by the component mounting apparatus is improved.

The first aspect of the invention provides a tape cutting device that cuts off an empty tape, which is discharged from a tape feeder after supplying components to a component mounting apparatus by pitch-feeding a tape containing the components, by opening and closing two cutting blades actuated by a pneumatic actuator driven by a supply of a pressurized air from a pneumatic pressure source controlled by a control valve, comprising:

a blade closing mechanism which closes said two cutting blades when the supply of the pressurized air from the pneumatic pressure source to the pneumatic actuator is stopped.

According to the second aspect of the invention, the blade closing mechanism includes the pneumatic actuator, the control valve and a check valve inserted in a pipe passage between the pneumatic actuator and the control valve, when the supply of the pressurized air from the pneumatic pressure source to the pneumatic actuator is stopped by releasing the pipe passage to an atmospheric environment, the check valve closes the pipe passage to generate a pressure between the pneumatic actuator and the check valve, and the control valve drives the pneumatic actuator by the pressure generated between the pneumatic actuator and the check valve.

According to the third aspect of the invention, the blade closing device includes the pneumatic actuator, the control valve and an urging spring which urges one of said two cutting blades to approach the other of said two cutting blades, when the supply of the pressurized air from the pneumatic pressure source to the pneumatic actuator is stopped by releasing a pipe passage between the pneumatic pressure source and the pneumatic actuator to an atmospheric environment, the control valve lets ports of the pneumatic actuator released to the atmospheric environment so that said two cutting blades are brought into a condition of freely openable and closable, the urging spring urges one of said two cutting blades to approach the other of said two cutting blades.

The fourth aspect of the invention provides a tape feeder changing carriage having a carriage body portion which is adapted to attach and detach to a component mounting apparatus by operating a handle and with which an install and a removal of a plurality of tape feeders mounted thereon to the component mounting apparatus are performed comprising:

a tape cutting device as described foregoing, wherein a pipe passage between the pneumatic pressure source and the control valve is formed by coupling a first connector connected to the control valve provided in the car body portion and a second connector connected to the pneumatic pressure source provided, and the supply of the pressurized air from the pneumatic pressure source to the pneumatic actuator is stopped by releasing the pipe passage to the atmospheric environment when the first connector and the second connector are detached from each other.

The fifth aspect of the invention provides a tape feeder changing carriage having a carriage body portion which is adapted to attach and detach to a component mounting apparatus by operating a handle and with which an install and a removal of a plurality of tape feeders mounted thereon to the component mounting apparatus are performed comprising: a tape cutting device which cuts an empty tape discharged after a tape feeder pitch-feeds a tape which carries components to supply the components to the component mounting apparatus, wherein the empty tape discharged from the tape feeder is directly transported to the tape cutting device without passing the component mounting apparatus.

According to the sixth aspect of the invention, the tape feeder changing carriage further comprises a tape collecting portion disposed below the tape cutting device which collects the empty tape cut off by the tape cutting device.

As described above, the tape cutting device according to the invention includes a blade closing mechanism to have two cutting blades closed when the supply of the pressurized air from the pneumatic pressure source to the pneumatic actuator is stopped. Therefore, it is prevented that foreign matters intervene between two cutting blades to cause a trouble when the tape cutting device is not operated.

In the tape feeder changing carriage of the invention, since the tape cutting device is provided in the carriage body portion, and the empty tape discharged from the tape feeder is transported directly to the tape cutting device and cut off without passing the component mounting apparatus, the operation to introduce the tape led from each tape feeder to the tape cutting device can be performed prior to install the tape feeder to the component mounting apparatus, namely prior to attach the tape feeder changing carriage to the component mounting apparatus. Further, each tape feeder can be removed from the component mounting apparatus by detaching the tape feeder changing carriage from the component mounting apparatus even in a state that the empty tape extended from the tape feeder has not been removed from the tape cutting device. Therefore, the operating time required to install or remove the tape feeders can be reduced so that throughput of mounting components by the component mounting apparatus is improved based on this reduction of the operating time.

DETAILED DESCRIPTION OF THE PREFERRED EMBODIMENTS

Embodiment 1

Figure 1:
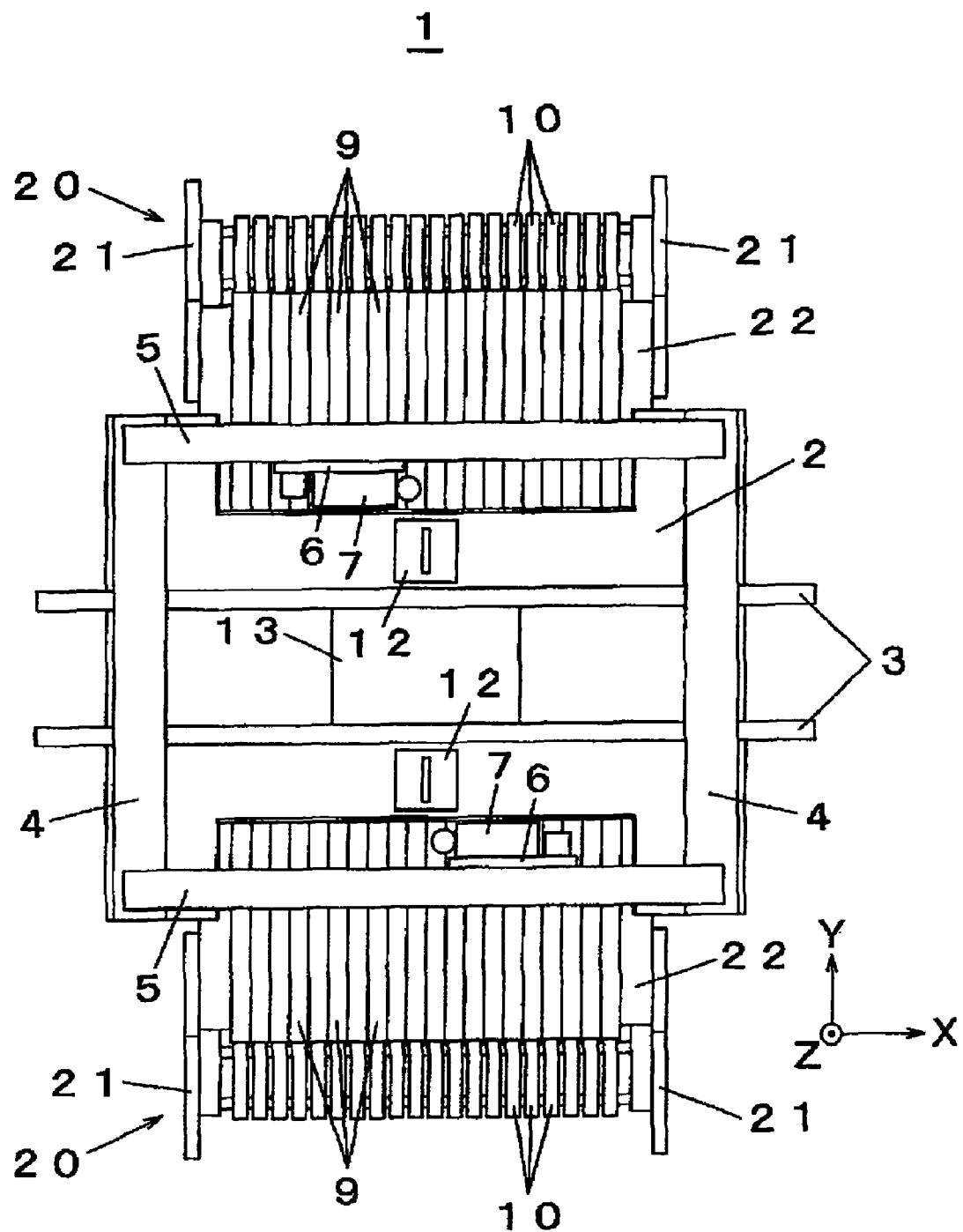
FIG. 1 shows a plan view of a component mounting apparatus according to Embodiment 1 of the invention.
Figure 2:
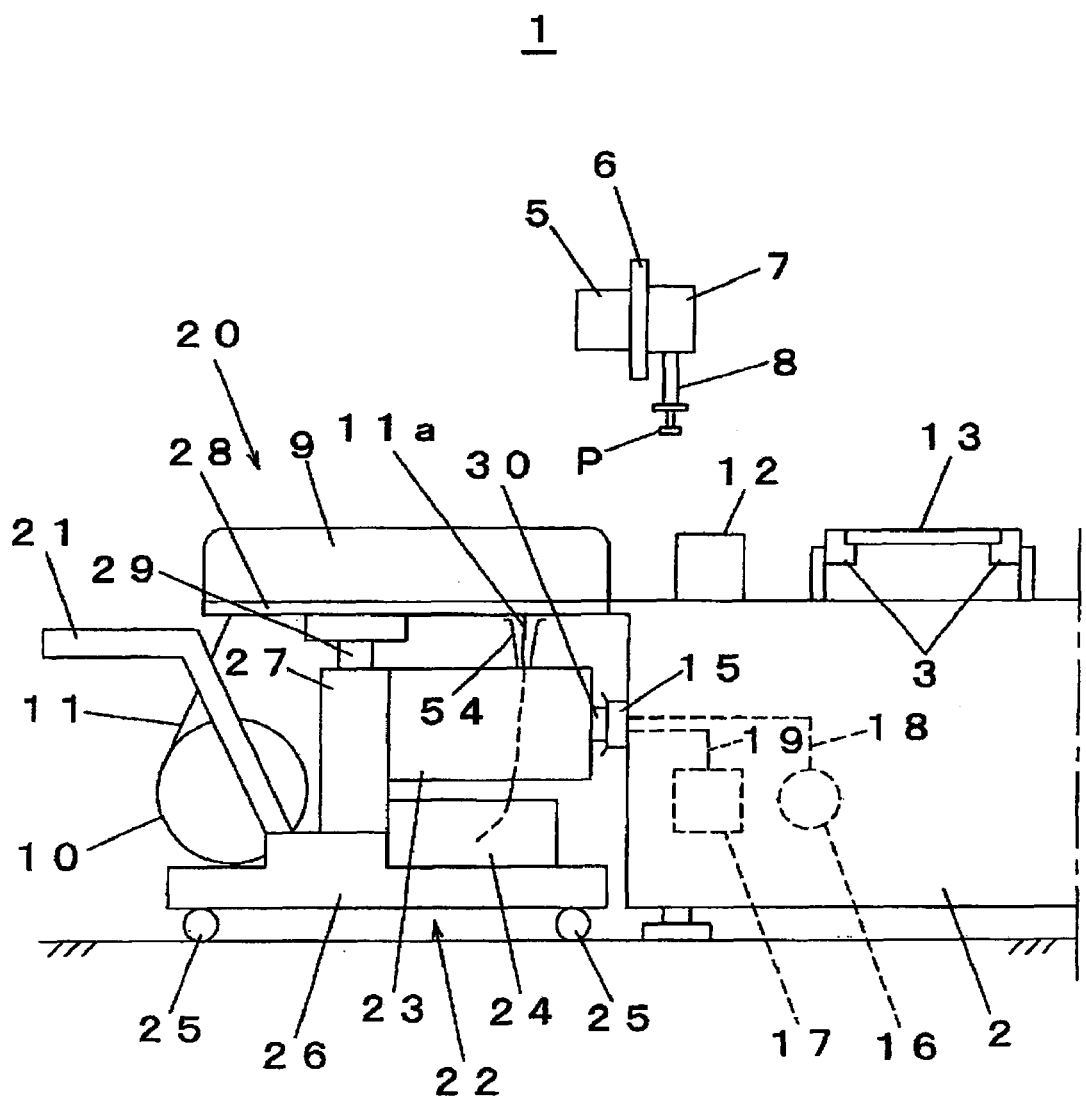
FIG. 2 shows a side view of a part of the component mounting apparatus and a tape feeder changing carriage according to Embodiment 1 of the invention.
Figure 3:
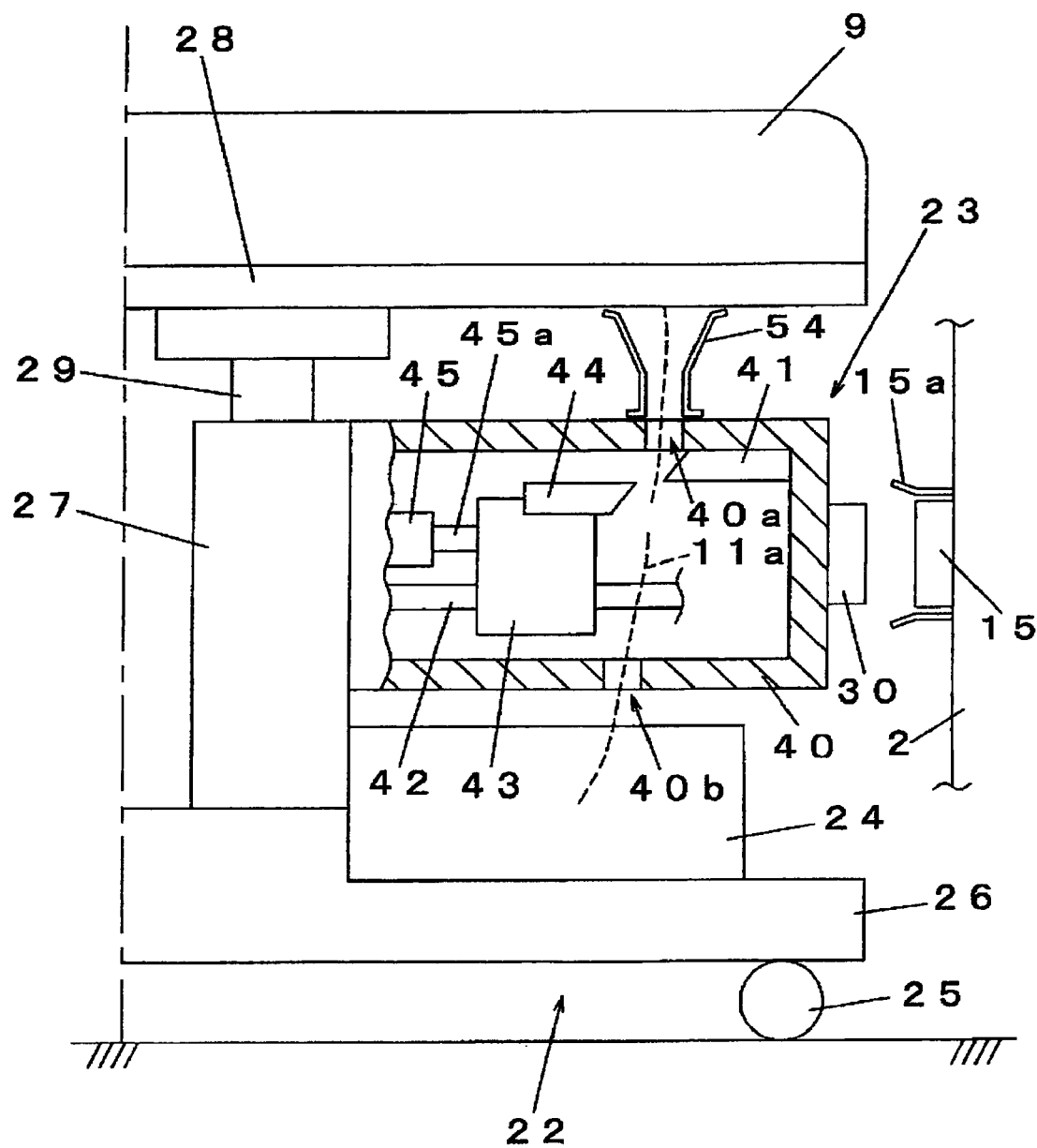
FIG. 3 shows a partial enlarged sectional view of the tape feeder changing carriage according to Embodiment 1 of the invention.
Figure 4:
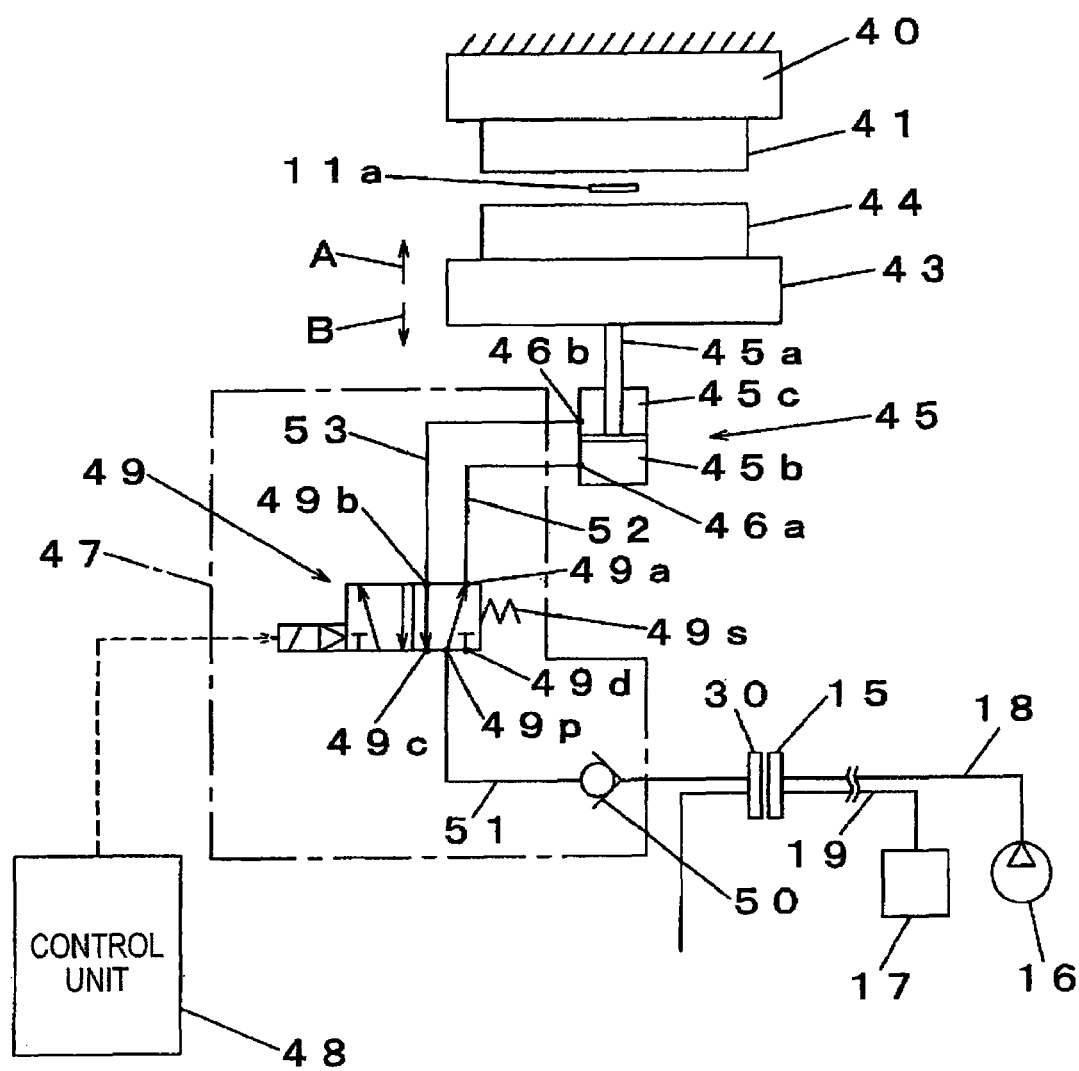
FIG. 4 shows an explanatory view of a pneumatic circuit provided in the tape feeder changing carriage according to Embodiment 1.

FIG. 1 shows a plan view of a component mounting apparatus according to Embodiment 1 of the invention. FIG. 2 shows a side view of a part of the component mounting apparatus and a tape feeder changing carriage according to Embodiment 1 of the invention. FIG. 3 shows a partial enlarged sectional view of the tape feeder changing carriage according to Embodiment 1 of the invention. FIG. 4 shows an explanatory view of a pneumatic circuit provided in the tape feeder changing carriage according to Embodiment 1.

As shown in FIGS. 1 and 2, a substrate transportation path 3 is provided on a base 2 of the component mounting apparatus 1 so as to extend along one direction (X-axis direction) in a horizontal plane. Two Y-axis tables 4 are provided above the substrate transportation path 3 so as to extend along another direction (Y-axis direction) in a horizontal plane that is perpendicular to the substrate transportation path 3. Two X-axis tables 5 are provided above these two Y-axis tables 4, so that each X-axis table 5 is supported by the Y-axis tables 4 at its opposite edges so as to be movable along the Y-axis direction. Moving stages 6 are provided on each of the X-axis table 5 so as to be movable along the X-axis table 5, and head portions 7 are provided on each of the moving stage 6. Nozzles 8 movable along a vertical direction (Z-axis direction) and around the Z-axis are provided on each of the head portions 7 so as to extend downwardly.

At opposite edges of the base 2, a plurality of tape feeders 9 are disposed so as to project outwardly in the Y-axis direction. Each tape feeder 9 intermittently feeds a tape 11 which is led from a reel 10 (the reel 10 is provided in a tape feeder changing carriage 20 as described below: see FIG. 2.) so as to supply components (electronic components) P which are contained within the tape 11 at a constant pitch to a predetermined pick-up position on the tape feeder 9.

Each head portion 7 moves in a horizontal plane by movement along the Y-axis direction by the X-axis table 5 and movement along the X-axis direction by the moving stage 6, and picks up a component P that is supplied to the pick-up position by the tape feeder 9 by means of vacuum suction with the nozzle 8. Then, after having the picked-up component P recognized by a component camera 12 provided on the base 2, the component P is mounted on a predetermined substrate 13 disposed on the substrate transportation path 3 through performing a positional compensation operation.

The plural tape feeders 9 supplying the components P to the component mounting apparatus 1 are mounted on the tape feeder changing carriage 20 which is movable with respect to the component mounting apparatus 1, such that the tape plural feeders 9 can be installed and removed collectively to the component mounting apparatus 1 by attaching and detaching the tape feeder changing carriage 20 to the component mounting apparatus 1. The description will be made to the construction of the tape feeder changing carriage 20 below with reference to FIGS. 2, 3 and 4.

As shown in FIG. 2, the tape feeder changing carriage 20 includes a carriage body portion which is movable by pressing and pulling operation of handles 21 disposed on left and right sides (The direction normal to the paper is refereed to the left and right direction in FIG. 2) and a tape cutting device 23 and a tape collecting device 24 provided in the carriage body portion 22.

The carriage body portion 22 includes a base portion 26 provided with rollers 25, a post 27 extending upwardly from the base portion 26 and a feeder base 28 horizontally provided at an upper end of the post 27. The handles 21 are attached on the left and right sides of the base portion 26.

The feeder base 28 is provided with a plate member on which the plural tape feeders 9 are mounted in parallel along the left and right direction and which is guided by a plurality of columnar lifting guides 29 extending upwardly from the post 27 so as to be adjustable in moving up and down.

As shown in FIGS. 3 and 4, the tape cutting device 23 cuts the tape discharged from each tape feeder 9 (so called empty tape as indicated with reference numeral 11a in FIG. 2) by opening and closing operation of two cutting blades (stationary blade 41 and movable blade 44 as described later). The tape cutting device 23 includes a box-shaped base part 40 fixed in front of the post 27 of the carriage body portion 22, the stationary blade 41 facing an upper opening 40a of the base part 40, a slider 43 guided by a guide member extending horizontally so as to be movable relatively to the stationary blade 41 in the horizontal direction, the movable blade 44 attached to the slider 43 as well as a pneumatic actuator 45 coupled to the slider 43 at a piston rod 45a, a pneumatic circuit 47 controlling operation of the pneumatic actuator 45 and a control unit 48 of the pneumatic circuit 47. The tape collecting device is provided with a box-shaped member whose upper side opens and is provided below the tape cutting device 23.

For installing each tape feeder 9 to the component mounting apparatus, the tape feeder changing carriage 20 on the feeder base 28 of which the plural tape feeders 9 are mounted is moved by operating the handles 21 so as to be positioned and attached with respect to the base 2 of the component mounting apparatus 1. When the tape feeder changing carriage 20 is attached to the base 2, a carriage-side connector 30 (first connector) provided on a front face of the base part 40 and a mounting apparatus-side connector 15 (second connector) provided on the base 2 are fitted in the horizontal direction and connected to each other.

The carriage-side connector 30 is a floating connector which is movable in a plane perpendicular to the fitting direction with the mounting apparatus-side connector 15, and the mounting apparatus-side connector 15 is provided with a fitting guide 15a supporting a fitting operation by receiving the carriage-side connector 30 (See FIG. 3). Accordingly, even if a small positional difference is formed between the connectors 30,15 at the time the tape feeder changing carriage 20 is positioned with respect to the base 2, the connectors 30,15 are connected to each other without any trouble at the time the tape feeder changing carriage 20 is attached to the base 2 as the carriage-side connector 30 is introduced into the mounting apparatus-side connector 15 by means of the fitting guide 15a.

A pneumatic generation unit 16 and electric power unit 17 are built-in in the component mounting apparatus 1. The pneumatic generation unit 16 and the electric power unit 17 are connected to the mounting apparatus-side connector 15 through a pipe 18 and a wire 19. Therefore, by fitting the carriage-side connector 30 and the mounting apparatus-side connector 15 with each other, the pneumatic generation unit 16 and the electric power unit 17 located on the component mounting apparatus 1 side can be utilized on the tape feeder changing carriage 20 side. More specifically, the pneumatic generation unit 16 can be utilized as a pneumatic source for the pneumatic actuator 45 and the electric power unit 17 can be utilized as an electricity source for the control unit 48.

As shown in FIG. 4, the pneumatic actuator 45 includes a cap-side cylinder chamber 45b and a head-side cylinder chamber 45c. When pressurized air is supplied into the cap-side cylinder chamber 45b, the piston rod 45a is advanced so that the movable blade 44 relatively approaches to the stationary blade 41 (closing operation of the cutter blades: arrow A in FIG. 4). On the other hand, when the pressurized air is supplied into the head-side cylinder chamber 45c, the piston rod 45a is retreated so that the movable blade 44 leaves the stationary blade 41 (opening operation of the cutter blades: arrow B in FIG. 4).

As shown in FIG. 4, the pneumatic circuit 47 includes a control valve 49 and a check valve 50 as well as a first pipe passage 51, a second pipe passage 52 and a third pipe passage 53. The control valve 49 is a two-position/two-direction electro-magnetic pilot valve, in which a spool (not-illustrated) is positioned at a normal position (the position shown in FIG. 4) by action of a return spring 49s when no spool driving signal is output from the control unit 48. On the other hand, when the spool driving signal is output from the control unit 48, the spool is moved and positioned at a change position by means of a pilot pressure generated in response to the spool driving signal against the urging force of the return spring 49s.

The first pipe passage 51 is a pipe passage connecting between the carriage-side connector 30 and a pressure port 49p of the control valve 49. The second pipe passage 52 is a pipe passage connecting between a first cylinder port 49a of the control valve 49 and a first port 46a connecting to the cap-side cylinder chamber 45b of the pneumatic actuator 45. The third pipe passage 53 is a pipe passage connecting between a second cylinder port 49b of the control valve 49 and a second port 46b of the head-side cylinder chamber 45c.

The check valve 50 is inserted in the first pipe passage 51 and is operated such that the first pipe passage 51 is opened when the pressure on the carriage-side connector 30 side is higher than that on the pneumatic actuator 45 side and the first pipe passage 51 is closed when the pressure on the carriage-side connector 30 side is lower than that on the pneumatic actuator 45 side.

In the state that the spool of the control valve 49 is positioned at the normal position, the pressure port 49p and the first cylinder port 49a are communicated with each other, and the second cylinder port 49b and a first tank port 49c are communicated with each other. At this time, pressurized air supplied from the pneumatic generation unit 16 through the carriage-side connector 30 is supplied to in the order of the first pipe passage 51, the control valve 49 (the pressure port 49p and the first cylinder port 49a), the second pipe passage 52, the cap-side cylinder chamber 45b of the pneumatic actuator 45 so that the piston rod 45a is advanced to close two cutting blades. On the other hand, in the state that the spool of the control valve 49 is positioned at the change position, the pressure port 49p and the second cylinder port 49b are communicated with each other. At this time, pressurized air supplied from the pneumatic generation unit 16 through the carriage-side connector 30 is supplied to in the order of the first pipe passage 51, the control valve 49 (the pressure port 49p and the second cylinder port 49b), the third pipe passage 53 and the head-side cylinder chamber 45c of the pneumatic actuator 45, so that the piston rod 45a is retreated to open two cutting blades.

The tape feeder 9 feeds the tape 11 during the course of the component mounting process by the component mounting apparatus 1 to supply the components P to the pick-up position and simultaneously discharges the empty tape 11a after the component supply below the feeder base 28. The empty tape 11a after the component supply discharged from the tape feeder 9 enters directly into the base part 40 of the tape cutting device 23 through the upper opening 40a, while being guided by a tape guide member 54 erected on an upper surface of the base part 40 without passing any member on the component mounting apparatus side. Then the empty tape 11a is transported between the stationary blade 41 and the movable blade 44 (See also FIG. 4).

During the course of supplying the components P to the component mounting apparatus 1 by feeding the tape 11 with the tape feeder 9, the control unit 48, the opening operation and the closing operation of two cutting blades are repeatedly performed by controlling the pneumatic circuit 47 and the control valve 49. In addition, the tape feeder 9 feeds the tape 11 to the outside of the tape feeder 9 (below the feeder base 28) by an intermittent operation. Accordingly, the empty tape 11a, which is discharged from the tape feeder 9 and enters into the base part 40 through the upper opening 40a while being guided by the tape guide member 54, is cut off by the tape cutting device 23 at a feeding advancement of a constant length. The empty tape 11a cut off at the constant length is discharged to outside of the base part 40 through a lower opening 40b provided at a lower portion of the base part 40 and is collected in the tape collecting portion 24.

On the other hand, from such a state that the tape feeder changing carriage 20 is attached to the component mounting apparatus 1, each tape feeder 9 can be removed from the component mounting apparatus 1 by detaching the tape feeder changing carriage 20 can be detached from the component mounting apparatus 1. At this time, since the carriage-side connector 30 is detached from the mounting apparatus-side connector 15, the pneumatic generation unit 16 and the electric power unit 17 provided on the component mounting apparatus 1 side cannot be utilized thereafter for the tape feeder changing carriage 20. By detaching the carriage-side connector 30 from the mounting apparatus-side connector 15, the pipe passage connecting between the pneumatic generation unit 16 and the control valve 49 (the first pipe passage 51) is released to atmospheric environment and the electricity is not supplied anymore to the control unit 48 to stop controlling the control valve 49, so that the spool of the control valve 49 is returned to the normal position by action of the return spring 49s.

As described above, when the pipe passage between the pneumatic generation unit 16 and the control valve 49 (the first pipe passage 51) is released to the atmospheric environment to stop supplying pressurized air to the pneumatic actuator 45, and the spool of the control valve 49 is returned to the normal position, the check valve 50 inserted in the first pipe passage 51 closes the first pipe passage 51. Therefore, the pressure is generated between the pneumatic actuator 45 and the check valve 50. The control valve 49 is positioned at the normal position to communicate the first pipe passage 51 to the first port 46a of the pneumatic actuator 45 as well as to communicate the second port 46b of the pneumatic actuator 45 to the first tank port 49c to be released to the atmospheric environment. As a result, the pressure generated between the pneumatic actuator 45 and the check valve 50 is subjected to the cap-side cylinder chamber 45b through the first port 46a of the pneumatic actuator 45. Accordingly, the pneumatic actuator 45 is actuated to advance the piston rod 45a, so that the movable blade 44 is moved to the stationary blade 41 to close two cutting blades (namely, the stationary blade 41 and the movable blade 44).

As described above, the tape cutting device 23 provided in the tape feeder changing carriage 20 according to the present embodiment includes a blade closing mechanism to have two cutting blades closed when the supply of the pressurized air from the pneumatic generation unit 16 to the pneumatic actuator 45 is stopped. Therefore, it is prevented that foreign matters intervene between two cutting blades (the stationary blade 41 and the movable blade 44) to cause a trouble when the tape cutting device 23 is not operated.

The above-mentioned blade closing mechanism is provided with the pneumatic actuator 45, the control valve 49 and the check valve 50 inserted in the first pipe passage 51 as the pipe passage between the pneumatic generation unit 16 and the control valve 49. When the first pipe passage 51 is released to the atmospheric environment and the supply of the pressurized air from the pneumatic generation unit 16 to the pneumatic actuator 45 is stopped, the check valve 50 closes the first pipe passage 51 to generate pressure between the pneumatic actuator 45 and the check valve 50. Thus, the blade closing mechanism is configured such that the control valve 49 drives the pneumatic actuator 45 with the pressure generated between the pneumatic actuator 45 and the check valve 50 to close two cutting blade (the stationary blade 41 and the movable blade 44).

Further, in the tape feeder changing carriage 20 according to the present embodiment the tape cutting device 23 is provided in the carriage body portion 22, and the empty tape 11a discharged from each tape feeder 9 is transported directly to the tape cutting device 23 and cut off without passing the component mounting apparatus 1, the operation to introduce the tape 11 led from each tape feeder 9 to the tape cutting device 23 can be performed prior to install the tape feeder 9 to the component mounting apparatus 1, namely prior to attach the tape feeder changing carriage 20 to the component mounting apparatus 1. Further, each tape feeder 9 can be removed from the component mounting apparatus 1 by detaching the tape feeder changing carriage 20 from the component mounting apparatus 1 even in a state that the empty tape 11a extended from the tape feeder 9 has not been removed from the tape cutting device 23. Therefore, the operating time required to install or remove the tape feeders 9 can be reduced so that throughput of mounting components by the component mounting apparatus 1 is improved based on this reduction of the operating time.

Embodiment 2

Figure 5:
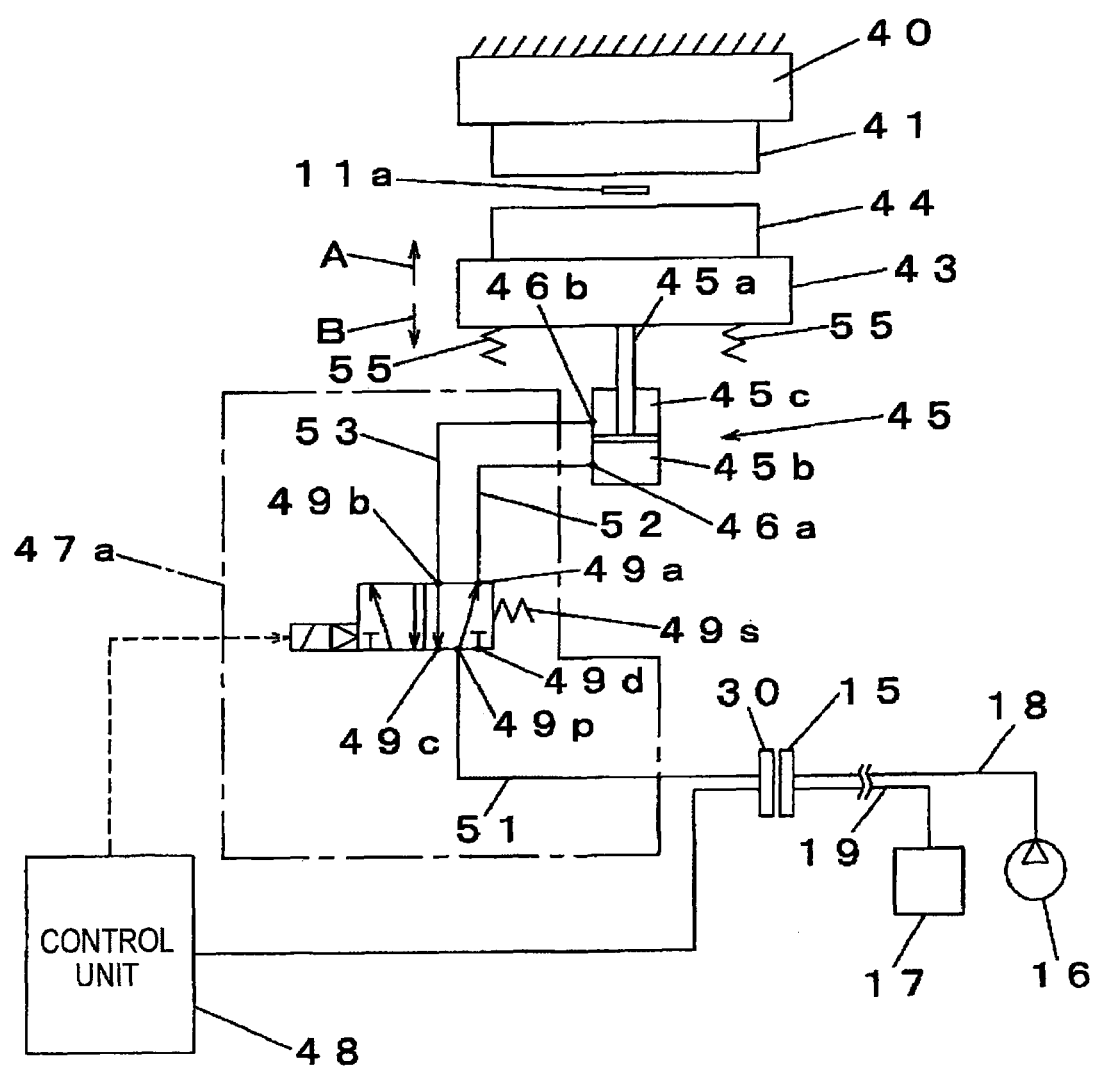
FIG. 5 shows an explanatory view of a pneumatic circuit provided in a tape feeder changing carriage provided for a component mounting apparatus according to Embodiment 2.

FIG. 5 shows an explanatory view of a pneumatic circuit provided in a tape feeder changing carriage provided for a component mounting apparatus according to Embodiment 2. The difference between the pneumatic circuit 47a according to Embodiment 2 and the pneumatic circuit 47a according to Embodiment 1 is that the check valve 50 is not provided in the first pipe passage 51 as provided in the pneumatic circuit 47 according to Embodiment 1. Instead of the check valve, an urging spring 55 is provided to urge one of the cutting blades to approach the other (the movable blade 44 approaches the stationary blade 41).

As shown in FIG. 5, when the carriage-side connector 30 is detached from the mounting apparatus-side connector 15, the first pipe passage 51 is released to the atmospheric environment and the spool of the control valve 49 is positioned at the normal position by action of the return spring 49s. At this time, the control valve 49 lets the first port 46a of the pneumatic actuator 45 released to the atmospheric environment through the control valve 49 and the first pipe, and lets the second port 46b of the pneumatic actuator 45 released to the atmospheric environment through the first tank port 49c of the control valve 49, so that the piston rod 45a of the pneumatic actuator 45 is brought into a movable condition by external force. That is, two cutting blades are brought into a condition to be freely openable and closable by external force. Therefore, the movable blade 44 is urged by the urging spring 55 to be moved to the stationary blade 41 side, and the two cutting blades consisting of the stationary blade 41 and the movable blade 44 are closed.

Also in the construction of Embodiment 2, the advantages same as Embodiment 1 can be obtained. Incidentally, in Embodiment 2, the blade closing mechanism is provided with the pneumatic actuator 45, the control valve 49 and the urging spring 55 which urges one of two cutting blades so as to approach the other (the movable blade 44 approaches the stationary blade 41). When the first pipe passage 51 is released to the atmospheric environment and the supply of the pressurized air from the pneumatic generation unit 16 to the pneumatic actuator 45 is stopped, the control valve 49 lets the ports (the first port 46*a* and the second port 46*b*) of the pneumatic actuator 45 released to the atmospheric environment, so that two cutting blades are brought into a condition to be freely openable and closable and one of the cutting blades. Thus, the blade closing mechanism is configured such that the urging spring 55 urges one of the cutting blades (the movable blade 44) so as to approach the other (the stationary blade 41), closing two cutting blades.

Embodiment 3

Embodiment 3 is constructed by adding the urging spring 55 provided in Embodiment 2 into the construction according to Embodiment 1. In such construction, two cutting blades are not closed only when the supply of the pressurized air from the pneumatic generation unit 16 to the pneumatic actuator 45 is stopped by releasing the pipe passage (the first pipe passage 51) between the pneumatic generation unit 16 and the control valve 49 to the atmospheric environment as Embodiment 1, two cutting blades are reliably closed also by action of the urging spring 55 after the pressure in the cap-side cylinder chamber 45*b* of the pneumatic actuator 45 is decreased to a pressure level of atmospheric environment to lose the closing function by the check valve 50 in the first pipe passage 51.

Although the foregoing embodiments are described in detail, the scope of the invention is not limited to these embodiments. For example, although the pneumatic actuator 45 is provided as a pneumatic cylinder in the foregoing embodiments, it should not be limited only to the pneumatic cylinder and it is applicable any other kind of pneumatic actuator (e.g. a pneumatic motor) as long as it is operated to feed the empty tape 11*a* discharged from the tape feeder 9 by means of the supply of the pressurized air from a pneumatic pressure source (the pneumatic generation unit 16 in the embodiments) controlled by the control valve 49, and is operated to open and close two cutting blades (the stationary blade 41 and the movable blade 44) to cut off the tape by means of the same. Further, it is not limited to the pneumatic actuation, but electric motor or the like and any other actuators generally used may be also applicable.

Furthermore, although two cutting blades provided in the tape cutting device 23 are consist of the stationary blade 41 fixed to the base part 40 as one and the movable blade 44 provided so as to be movable with respect to the stationary blade 41 in the foregoing embodiments, as the other, it is not limited to such construction in that one is a movable blade and the other is a stationary blade and both of the cutting blades may be movable to each other to perform a cutting operation (namely both cutting blades are movable blades).

According to the invention, it is possible to prevent an intervention of foreign matters between two cutting blades in the tape cutting device when the tape cutting device is not operated.

According to the invention, it is possible to reduce operating time required to install or remove the tape feeders with the tape feeder changing carriage so that throughput of mounting the components by the component mounting apparatus is improved.

The present application is based upon and claims the benefit of priority of Japanese patent applications Nos. JP 2007-230954 filed on Sep. 6, 2007 and JP 2007-230955 filed on Sep. 6, 2007, the entire contents of which are incorporated herein by references.

What is claimed is:

1. A tape cutting device for cutting off an empty tape, comprising:
    a tape feeder configured to pitch-feed a tape containing components and discharge the empty tape after supplying the components to a component mounting apparatus;
    a pneumatic actuator driven by a supply of a pressurized air from a pneumatic pressure source controlled by a control valve configured to control a flow direction of the pressurized air;
    two cutting blades actuated by the pneumatic actuator; and
    a blade closing mechanism which is configured to cut the empty tape and which closes said two cutting blades when the supply of the pressurized air from the pneumatic pressure source to the pneumatic actuator is stopped.

2. The tape cutting device according to claim 1, wherein the blade closing mechanism includes the pneumatic actuator, the control valve and a check valve inserted in a pipe passage between the pneumatic pressure source and the control valve,
    when the supply of the pressurized air from the pneumatic pressure source to the pneumatic actuator is stopped by releasing the pipe passage to an atmospheric environment, the check valve closes the pipe passage to generate a pressure between the pneumatic actuator and the check valve, and
    the control valve drives the pneumatic actuator by the pressure generated between the pneumatic actuator and the check valve.

3. The tape cutting device according to claim 1, wherein the blade closing mechanism includes the pneumatic actuator, the control valve and an urging spring which urges one of said two cutting blades to approach the other of said two cutting blades,
    when the supply of the pressurized air from the pneumatic pressure source to the pneumatic actuator is stopped by releasing a pipe passage between the pneumatic pressure source and the pneumatic actuator to the atmospheric environment, the control valve lets ports of the pneumatic actuator released to the atmospheric environment so that said two cutting blades are brought into a condition of freely openable and closable,
    the urging spring urges one of said two cutting blades to approach the other of said two cutting blades.

4. A tape feeder changing carriage with which a plurality of tape feeders mounted thereon can be installed on or removed from a component mounting apparatus, the tape feeder changing carriage comprising:
    a carriage body portion configured to be attached and detached from a component mounting apparatus by operating a handle;
    a tape cutting device according to claim 1,
    wherein a pipe passage between the pneumatic pressure source and the control valve is formed by coupling a first connector connected to the control valve provided in the carriage body portion and a second connector connected to the pneumatic pressure source provided, and
    the supply of the pressurized air from the pneumatic pressure source to the pneumatic actuator is stopped by releasing the pipe passage to the atmospheric environment when the first connector and the second connector are detached from each other.

5. A tape feeder changing carriage with a plurality of tape feeders mounted thereon which can be installed on or removed from a component mounting apparatus, the tape feeder changing carriage comprising:
   the tape cutting device of claim 1 and
   a carriage body portion configured to be attached to and detached from a component mounting apparatus by operating a handle;
   wherein the tape cutting device is configured to cut an empty tape discharged from the tape feeder, and
   wherein the empty tape discharged from the tape feeder is directly transported to the tape cutting device without passing the component mounting apparatus.

6. The tape feeder changing carriage according to claim 5, further comprising a tape collecting portion disposed below the tape cutting device which collects the empty tape cut off by the tape cutting device.

* * * * *